PUSHBUTTON SWITCH

Filed June 24, 1965 2 Sheets-Sheet 1

INVENTORS
JOHN R. BRAND
LOUIS OLAH
CLYDE L. TICHENOR
BY
Roger A. Marrs
AGENT

JOHN R. BRAND
LOUIS OLAH
CLYDE L. TICHENOR
INVENTORS

BY Roger A. Marrs

AGENT

United States Patent Office 3,342,967
Patented Sept. 19, 1967

3,342,967
PUSHBUTTON SWITCH
John R. Brand, Louis Olah, and Clyde L. Tichenor, Los Angeles, Calif., assignors to Warwick Electronics Inc., Chicago, Ill., a corporation of Delaware
Filed June 24, 1965, Ser. No. 466,539
19 Claims. (Cl. 200—159)

ABSTRACT OF THE DISCLOSURE

A pushbutton switch is provided having a body from which divergent and self-biasing leaf spring members extend and wherein each member terminates at its free end in a bifurcated contact. The contacts ride on the surface of a circuit board between selected conductive areas in such a fashion that rectilinear movement of the switch body causes the leaf members to diverge or spread so that the bifurcated contacts progress outwardly in opposite directions into contact with the conductive areas formed on the circuit board. Different contact member mounting blocks may be employed to movably carry the switch body which will accommodate a multiplicity of contact members.

This invention relates generally to switch apparatus and more particularly to a novel switch device for making and breaking electrical and mechanical connections between conductive areas forming a part of an electrical circuit.

There are in wide use many examples of modern electrical and electronic equipment and systems, such as electronic musical instruments, in which it is extremely useful and advantageous to have portions of the circuitry etched, printed, stamped and cemented, or mounted on small boards which are easily and quickly assembled into the equipment. The mass production manufacturing of circuit boards may, in some cases, be more or less standardized, as well as their stocking and distribution and the boards are made considerably more economic than in the case of conventionally constructed systems. In the planning and layout of the electrical circuit formed on the circuit board as described above, it is sometimes convenient to provide multiple conductive areas or pads which are detachably interconnected by means of a switch device so that a variety of electrical circuits can be selectively coupled and operated.

It is a general requirement with any such electrical contact that for reliability of continuous connection, there be a positive force holding the switch contacts and the conductive areas in communication, and that during the mating of the switch contacts with the conductive areas, contact bounce, sparking between the contact areas and switch noise be eliminated. Further, the greater the contact pressure, the greater the reliability ranging from a contact pair which intermittently opens, due, for example, to vibration or to differential thermal expansion, to a contact pair with such pressure that relative sliding between the contact areas is difficult or is damaging to the contact surfaces. Therefore, in general, contact pressure must be compromised to provide ease of mating the contact surfaces or areas and to prevent damage or inelastic springing of the contact elements.

Furthermore, particularly when the switches are used in connection with electronic musical instruments, the switches are intended to be actuated manually by a musician and it is important that a proper and desirable "feel" by the musician to the switch actuation be felt. The movement of the switch should indicate a smooth but solid and firm feel to the fingertips of the musician.

Another difficulty involved in the utilization of printed circuit boards is that of providing a locking mechanism for securing the switch device in a suitable contact position which is non-releasable except by manual positioning of the switch. Also, in some instances, such as in push button operation, it is desirable to provide a return mechanism to break contact between the switch contact and a conductive area upon the release of the switch.

In accordance with the present invention, these difficulties and problems are obviated by the employment of the present invention which provides a switch body having divergent and self biasing leaf spring members extending therefrom and terminating on their free ends in a bifurcated contact. The contacts ride on the surface of the circuit board between selected conductive areas or pads in such a fashion that movement of the switch body portion causes the leaf members to diverge or spread so that the bifurcated contacts progress outwardly in opposite directions into contact with the conductive areas or pads formed on the circuit board. Because of the leaf spring resiliency, contact return is assured without the provision for additional mechanism or biasing devices. A feature of the invention resides in a provision which permits the employment of different contact member mounting blocks to be movably carried on the switch body which will accommodate a multiplicity of contact means and thus allow for any desired multiplicity of switch poles. This construction permits a switch to be assembled according to a modular concept so that the switching poles of any actuator may be tailored to varying applications by insertion or removal of particular contact members into or from the mounting block.

Therefore, it is a primary object of the present invention to provide a novel switch apparatus which includes slidable divergent contacts that mate with electrical circuit contacts or conductive areas in such a manner that substantial contact pressure is involved as the contacts move into electrical and mechanical engagement with the circuit conductive areas or terminals.

Another object of the present invention is to provide a novel switch apparatus for circuit board use which assures that the contact points of the switch actuator are under tension when the contact points engage with the conductive areas or pads to effect a reliable and positive mechanical and electrical connection.

A further object of the present invention is to provide a switch apparatus capable of use as either a single throw switch or a double throw switch having a third position located in the center whereby the addition of a stop means may be readily employed to any such actuator therefor, or combination of switch actuators for converting the three position actuation to a two position movement.

Still another object of the present invention is to provide a switch apparatus which is manually actuated and which develops a solid and firm feel to the fingertip of the operator indicative of switch position and contact action.

Still another object of the present invention is to provide a switch apparatus which, when desired, provides very high electrical contact pressure.

It is another object of the present invention to provide a switch apparatus which is manually deflectable to slide or scrub over selected conductive surfaces mounted on a circuit board to effect mechanical and electrical connection between various conductive areas.

It is another object of the present invention to provide a switch apparatus which requires no compromise between wear resistant plating of the contacts and that surface which provides the best electrical conduction across the boundary.

It is a further object of the present invention to provide a novel switching apparatus which is not susceptible to contact damage due to contact bounce, sparking or excessive manual actuation pressure.

It is another object of the present invention to provide a switch apparatus which has wide dimensional tolerance in its manufacture and which is compact permitting high density installation and is inexpensive to fabricate.

The features of the present invention which are believed to be novel are set forth with particularity in the appended claims. The present invention both as to its organization and manner of operation, together with further objects and advantages thereof, may best be understood by reference to the following description, taken in connection with the accompanying drawings, in which:

Figure 4:
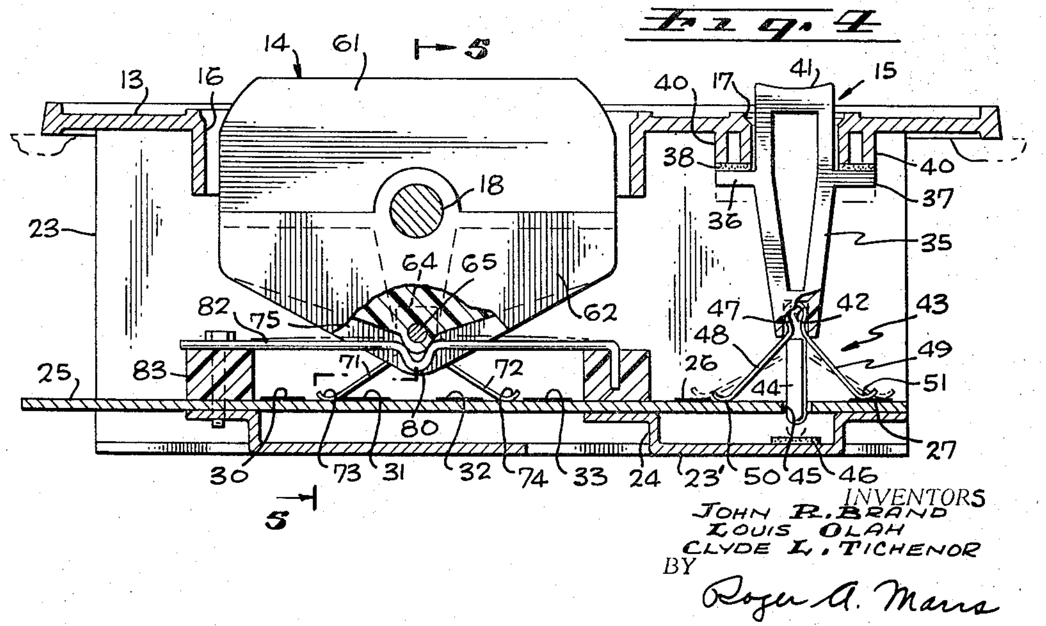
FIGURE 4 is an enlarged sectional view of the accessory control panel shown in FIGURE 3 taken along lines 4—4 thereof and illustrating the rocker and push button switch apparatus of the present invention and having portions thereof broken away on the switch apparatus to illustrate assembly and arrangement of components.
Figure 5:
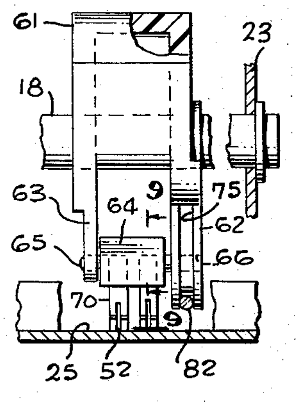
FIGURE 5 is a transverse sectional view of the rocker switch apparatus taken in the direction of arrows 5—5 of FIGURE 4.
Figure 7:
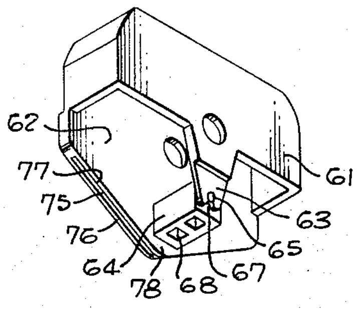
FIGURE 7 is a perspective view of the body and pivotal contact mounting block employed in the rocker switch apparatus of FIGURES 4–6.
Figure 8:
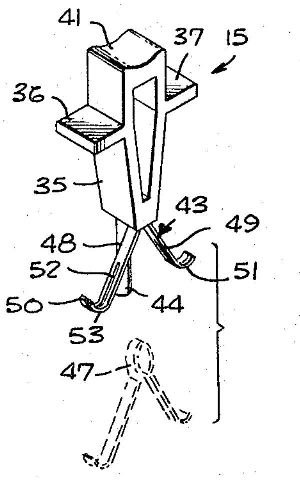
FIGURE 8 is a perspective view of the push button switch apparatus shown in FIGURE 4.
Figure 9:
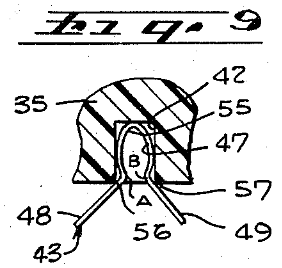
Figure 10:
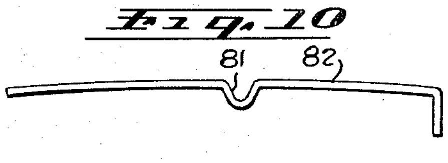

FIGURE 9 is an enlarged sectional view of a portion of the contact mounting block illustrating the mounting of a leaf spring contact member therein as employed in the rocker and push button switch apparatus shown in FIGURES 7 and 8; and FIGURE 10 is a side elevational view of a bowed wire spring biasing member employed in the rocker switch apparatus of FIGURES 4 and 5 to effect an overcenter toggle action.

Figures 1, 2:
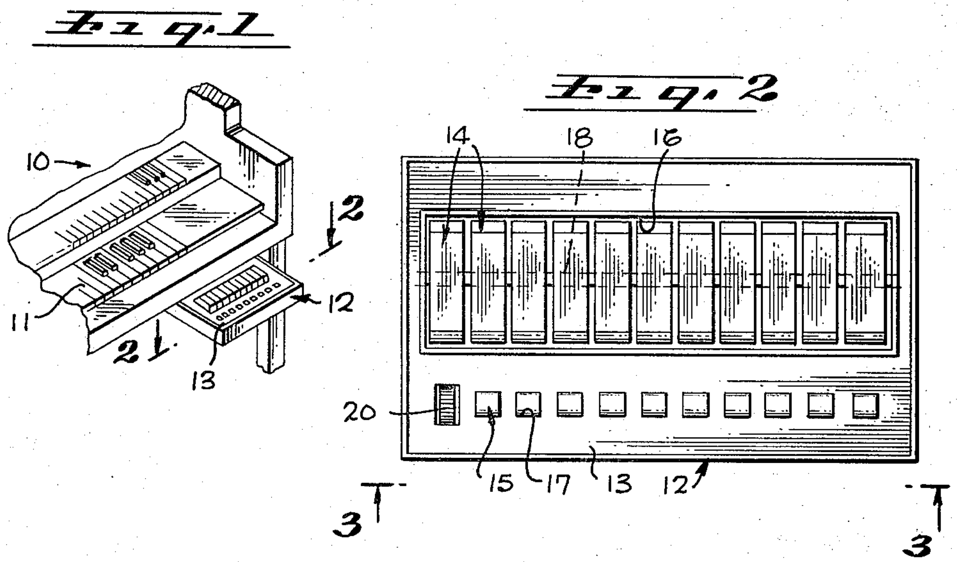
FIGURE 1 is a perspective view of an accessory control panel mounted on a portion of a musical instrument and which incorporates the switch apparatus of the present invention.
FIGURE 2 is a plan view of the accessory control panel shown in FIGURE 1 taken in the direction of arrows 2—2.

Referring now to FIGURE 1, a portion of a conventional musical instrument, such as the keyboard portion of an electronic organ, is shown in the general direction of arrow 10. Mounted under a keyboard 11 of the instrument, there is provided a compact accessory control cabinet 12 which carries a plurality of rocker tab and push button switches in accordance with the present invention. Preferably, the cabinet is slidably mounted on nylon casters for convenient movement forward to expose a control panel 13 in which the switches are set for access thereto by an operator or musician.

FIGURE 2 illustrates the cabinet 12 and more particularly, the high density mounting of a plurality of rocker tab switches, such as tab 14, arranged side-by-side in a longitudinal row and a plurality of push button switch tabs, such as push button tab 15, wherein the rocker and push button tabs incorporate the features of the present invention. The panel 13 includes an elongated cut-out 16 through which the finger engaging tops of the rocker tabs project and a plurality of individual cut-outs, such as cut-out 17, through which the finger engaging portion of the push button switch or tab project. The panel serves to cover the mechanism for the respective rocker and push button tabs as well as to prevent dirt and other foreign matter from collecting or interfering with the switch mechanisms.

The rocker and push button tabs may be employed for selectively operating various electrical circuits in connection with the operation of the electronic musical instrument and for selecting a variety of circuitry such as for example, various electronic voice circuits desired to be played by a musician. The rocker switches may be employed for effecting sustained switching between the varous circuits and are rotatably mounted on a common shaft 18 which lies beneath the control panel 13 and is supported on its opposite ends by the cabinet 12.

Located in a row parallel to the row of rocker tabs, the plurality of push buttons or tabs are arranged so that one push button resides in the same transverse plane of the panel with a particular rocker tab. The push buttons may be employed for momentary or sustained operation of a particular electronic circuit as long as the push button is depressed. It is to be noted that a rotary volume control 20 is located in line with the rocker tab 14 and may be electrically coupled into the circuit. Through the employment of the novel switch mechanism included in both the rocker and push button tabs, a high density arrangement of switch tabs may be accommodated in a relatively compact, space saving arrangement.

Figure 3:
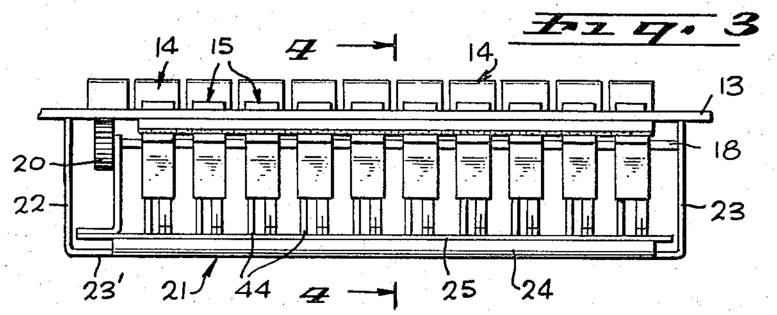
FIGURE 3 is a side elevational view of the accessory control panel shown in FIGURE 2 taken along the lines 3—3 thereof.

In FIGURE 3, the cabinet 12 is illustrated as including an open ended U-shaped frame in the direction of arrow 21 having upwardly extending sides 22 and 23 which are secured to the panel 13 along the top edge marginal regions of each frame side by any suitable means. Integrally connecting the frame sides, there is provided a support member 23' which constitutes the bottom of the cabinet. Support member 23' includes a raised mounting means 24 which may be formed by pressing portions of the support member inwardly to provide a suitable support for the mounting of a circuit board 25 such as previously described.

As shown more clearly in FIGURE 4, the circuit board 25 is provided on its upper surface with portions of electrically conductive areas comprising circuitry in which the conductive areas have been etched, printed, stamped and cemented or otherwise mounted on the surface of the board 25. The electrically conductive areas include contact terminals or pads 26 and 27 associated with the push button switch 15 and terminals or pads 30 through 33 associated with the rocker tab 14. It is to be understood that although only the conductive areas as numbered are shown in FIGURE 4, additional conductive areas are included which are arranged on the surface of the circuit board to provide electrical continuity in a prescribed and desired manner to effect electronic operation of various circuits (not shown) to derive the necessary effect through the manual selective actuation of particular rocker or push button tabs. However, it is also to be noted that between the pads of conductive areas, portions of the circuit board structure serve as insulation and that these portions of insulated circuit board also serve as a track or path extending between the terminal conductive areas or pads on which the contact elements of the switch mechanism may ride.

The push button switch 15 as shown in FIGURE 4 includes an elongated hollow body portion 35 which is slidably mounted through the cut-out 17 in the control panel. The body portion may preferably be formed, as by molding, from lightweight plastic materials. The body portion includes a pair of outwardly extending flanges 36 and 37 which engage, respectively, with a pair of damper or cushioning pads 38 secured to the underside of a projection 40 integrally formed from the control panel and which defines the cut-out 17. The flanges extend beyond the edges of the cut-out to stop or limit the body portion upward movement through the cut-out in the control panel. A slightly curved recess or depression 41 is formed in the top surface of the body portion which is intended to conform to the general outline of a fingertip and serves as an area to be pressed by an operator to actuate the switch mechanism. On the end of the body portion opposite to the finger recess 41, the body portion is provided with an open ended receptacle 42 into which is insertably mounted, a leaf spring member as indicated in the general direction of arrow 43. To maintain the body portion properly oriented within the cut-out 17 in the control panel, a guide pin 44 is carried on the body portion which extends through an aperture 45 formed in the circuit board 25. Thereby, rectilinear movement of the body portion 35 is assured by means of one end of the body portion being fitted through the cut-out in the control panel while its opposite end is restricted in transverse movement by means of the guide pin projecting through the aperture. To prevent excessive downward movement of the body portion into the control cabinet, the tip or terminating end of the guide pin is directed to engage with a damper pad 46 carried on the frame support member 23' so that movement of the body portion is limited in its downward direction. Therefore, it can be said that the pads 38 and 46 define the upward and downward terminating stop positions between which the body portion may be slidably moved. The relationship of the distance from the tip of the guide pin to the frame is in direct relationship to the height of the body portion projecting above the surface of the control panel 13 so that a proper "feel" for push button operation is offered to the operator.

The leaf spring member 43, as illustrated in FIGURES 4 and 8, is a single strip of electrically conductive material, such as copper or phospor bronze which may include a nickel gold plating, bent about its mid-section to form a loop 47 so as to provide a pair of diverging resilient contact arm members 48 and 49 which terminate at their free ends in a split or bifurcated contact element represented by numerals 50 and 51. The contact elements 50 and 51 are formed by bending back a small portion of the free end of each leaf spring arm member and by providing a small slit in each element, such as slit 52 in FIGURE 8, so as to provide a bifurcated contact element having redundant contact capability by means of the bifurcation and having a smooth rounded contact surface 53.

The contact surface 53 of each contact element rides on portions of the surface of the circuit board between areas of conductive material terminals or pads when the switch is actuated in order to interconnect selected pads. As shown in FIGURE 4, contact member 49 maintains contact element 51 in electrical and mechanical communication with pad 27 at all times. However, as shown in dotted lines, when the switch is pressed down, the contact element 51 travels on the pad 27 outwardly. With respect to contact element 50, the element is shown in solid lines resting on the surface of the circuit board out of communication with conductive pad 26. Upon depression of the switch body 35, contact element 50 rides on the surface of the circuit board and into communication with the pad 26. It is to be particularly noted that as the element 50 approaches pad 26, it is already under tension when the contact element 50 engages or strikes the pad 26. Upon release, the tension of the leaf spring member will return the contact elements and the body portion to their positions shown in solid lines.

Referring now to FIGURE 9, an enlarged sectional view of the body 35 is shown at its end having the receptacle 42 formed therein. The receptacle is provided with opposing straight wall surfaces against which the bent or formed mid-section of the leaf spring member 43 engages in frictional contact to retain the spring member 43 in the receptacle. The mid-section of the leaf spring 43 takes the form of loop 47 having an apex 55 that seats against the bottom wall of the receptacle. The diverging resilient contact arm members 48 and 49 are formed by bending the leaf spring member 43 at points A and B which coincide with the opening of the receptacle 42 and the base of the loop 47. Inasmuch as the leaf spring member is resilient, spring forces inherent in the member urge the formed loop to expand against the opposing side walls of the receptacle to hold the member by frictional forces in position. Furthermore, the contact arm members 48 and 49 are biased to diverge outwardly in opposite directions and may be said to pivot about points A and B with respect to the loop 47 and the receptacle 42. To assure long life and to reduce material fatigue, the entrance to the receptacle is provided with a chamfered corner 56 and 57 which permits the contact member to bend during switch operation without engaging the opposing walls defining the receptacle 42.

The leaf spring member 43 is further maintained within the body receptacle 42 by the spring action of the leaf spring member 43 wherein the contact element 50 and 51 engaging the circuit board causes the resilient leaf spring member to urge the body 35 upward so that flanges 36 and 37 abut against the pads 38. Also, depression of the body 35 operates against the upwardly directed spring force of the leaf member 43 so that in all body positions, the leaf spring member 43 is biased into the receptacle 42 of the body 35.

Figure 6:
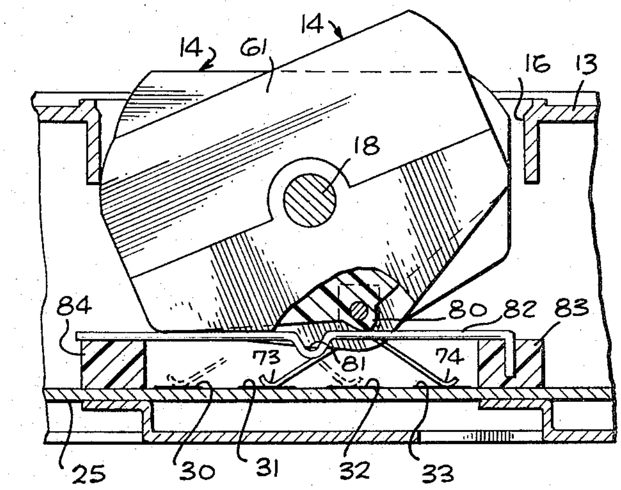
FIGURE 6 is a sectional view of the rocker switch apparatus similar to the view taken in FIGURE 4 illustrating the position of the rocker switch apparatus upon actuation of the apparatus to one of its multiple switch contact positions.

In FIGURE 4, the rocker tab switch 14 is shown mounted to pivot or rock on the shaft 18 extending between the frame side 23 and its counterpart at the other side of the assembly. The tab includes a top portion that projects above the surface of the control panel 13 through the elongated cut-out 16 for ready access thereto to accommodate manual actuation. The top portion of the tab may display suitable indicia indicating the various switch positions which when depressed will achieve desired circuit connections. In the present instance, the rocker tab switch includes three positions, one of which is the neutral position as shown in FIGURE 4. Another switch position is shown in FIGURE 6 wherein the left side of the switch is depressed below the surface of the control panel and the right hand side of the switch projects upward a suitable distance above the surface of the control panel and the finger engaging surface of other rocker switches arranged in the row on the common shaft 18. A third position would be represented by the reverse position of the switch as shown in FIGURE 6. It is to be understood that although no circuit connections are shown when the switch is in its neutral position, suitable circuit connections can be employed, if desired.

The rocker tab 14, shown more clearly in FIGURES 5 and 7, may preferably be formed, as by molding, from lightweight plastic materials. The tab is molded in the form of a shell body 61 having downwardly extending arms forming a yoke which comprises a rocker like arm member 62 extending from one side of the body 61 and an arm member 63 extending from the other side of the body in fixed space parallel relationship with respect to the yoke arm member 62. A block 64 is rotatably mounted on the yoke between the arm members thereof, as shown in FIGURE 6, by means of shaft elements 65 carried on opposite sides of the block which project into a hole 66 formed in the rocker arm member 62 and a snap type receiver 67 formed in the terminating end of the arm member 63. Block 64 may be composed of either insulative or electrical conductive materials, or combinations or both materials to avoid electrical interconnection between the contacts or to establish electrical communication therebetween as desired. Such construction permits the block to pivot or rotate on the shaft elements with respect to the tab body as the tab rotates about its shaft 18. The block 64 is provided with at least one receptacle, such as receptacle 68 as shown in FIGURE 7, for retaining a leaf spring member 70. The block receptacle and the leaf spring member 70 are identical to the form and construction of the receptacle and the leaf spring member shown in FIGURE 9 and the previous description of these elements will readily apply to the description of the rocker switch tab.

The distance between the block and the surface of the circuit board is less than the length of the formed leaf spring member 70 so that a constant tension is placed on the contact arm members 71 and 72 at all times. As shown in FIGURE 4, the switch body is in its neutral position so that the contact elements 73 and 74 of the leaf spring member 70 remain at rest on the electrically insulated circuit board area between areas of electrical conductivity. As shown in FIGURE 5, the switch has been actuated in a counterclockwise direction so that contact elements 73 and 74 are in communication with terminals or pads 31 and 33 as shown in solid lines. Actuation of the switch body in a clockwise direction would cause the contact elements to slide from their neutral position to the position as shown in dotted lines so as to interconnect pads 30 and 32. As in the embodiment of the push button switch, the contact elements 73 and 74 of the rocker switch tab are already under pressure as the contact elements slide into communication with the pads of conductive material.

Because of the applied tension in the contact arm members and hence the contact elements as well, when the contact elements strike the pads, contact bounce is avoided and thereby, switch noise is eleminated. It is to be particularly noted that in both the rocker tab switch and the push button tab switch, the vertical motion of the switches is converted to a spreading or alternately a closing together movement of the contact arm members and hence the contact elements move in opposite directions. A feature resides in the fact that as the contact elements slide over the terminals or pads, the contact surface of the pads are cleaned by the sliding or wiping action of the contact elements.

To maintain the rocker tab switch in selected positions, a spring biasing means is employed that operates against the rocker arm member 62. The free end of member 62 which extends beyond the pivot connection of the block 64 terminates with a groove 75 that extends from one end of the tab body to its opposite end. The groove is defined by side walls 76 and 77 which diverge at a small angle from a center region 78 that lies in a plane along the center vertical axis of the tab body. At the central region 78 of the rocker tab body where the side walls meet in a small angle, a detent 80 is formed which extends into the groove 75. The detent 80 is adapted to be received into a notch 81 formed in a spring member 82 midway between its opposite ends, such as is shown in FIGURES 4 and 10. The spring member 82 represents a simple wire form which is bent to provide a slight longitudinal bow between its opposite ends against which the detent presses and along the top of which the detent rides as the tab is pivoted about shaft 18. The spring member 82 is secured on one end in a mounting block 83 and has its opposite end resting on top of a block 84 arranged in fixed parallel relationship to the block 83 on the circuit board 25.

Prior to installation of the wire spring 82 on the mounting blocks, the spring has a definite bow formed therein as shown in FIGURE 10. However, after the spring has been mounted between the mounting blocks and the tab switch engaged therewith so that the wire is positioned within the groove 75 and the detent within the wire notch, the wire spring appears substantially flat and linear. The extent of the bow formed in the wire is also shown in broken lines in FIGURE 4 prior to compression. As the switch is depressed on either side of the shaft 18, the body rotates so that the detent is moved out of the notch and along the upper surface of the spring wire against the tension thereof. The detent travels on the wire until one extremity of the rocker body, such as is shown in FIGURE 6, butts against the wire spring end near one of the mounting blocks so that further rotation of the body on the shaft 18 is prevented. The body will remain in this position due to the biasing of the wire spring against the detent which has the effect of urging the switch body into further clockwise or counter-clockwise rotation which is opposed by the engagement of the rocker member extremity with the wire spring. The wire spring remains at all times within the defining walls of the groove 75 and continuously applies a biasing force to the detent to constitute an overcenter toggle means.

As will be understood by those skilled in the art, in operation, in response to the rocking of the tab 14, the bifurcated contact elements 73 and 74 will move on the surface of the circuit board 25 to connect either terminal pads 30 and 32 or terminal pads 30 and 33 depending upon either clockwise or counter-clockwise rotation of the body 61. During the rotary movement of the body, the block 64 pivots between the extended members 62 and 63 of the yoke so that the leaf spring member 70 may move rectilinearly to spread or alternately to draw the contact elements towards each other in response to the rotary movement of the body. The detent 80 and the spring 82 form a snap action mechanism for the body 61. When the tab body 61 is in its neutral position, as shown in FIGURE 4, the detent rests within the notch 81 of the spring 82 which compresses the spring so that a biasing force is directed against the body 61 and the fixed shaft 18. In the neutral position, the notch, detent and shaft all lie in a common vertical plane. When the tab body 61 is rocked to either position on opposite sides of the neutral position, the detent rides out of the notch on top of the spring until the end extremity of the body engages the top surface of one end of the spring. At this point, further rotation of the tab ceases. During the rotation of the tab, the spring 83 continues to direct its spring force against the detent; however, since the spring notch, detent and shaft 18 are no longer lying on a common plane, the spring force applied to the body via the detent forcibly urges the tab body to rotate in the manner of a conventional overcenter toggle action. It has been found through actual usage that a desirable "feel" to the fingers of a musician or operator is achieved and that the snap action of the overcenter toggle means is greatly effective to produce a satisfactory sensation of a firm touch to the operator.

Accordingly, it can be seen that the switch apparatus of the present invention provides a novel means for interconnecting terminals carried on the surface of a circuit board for example and that by employing a self-biasing switch contact member carried by the switch body which is formed to provide a pair of integral divergent arms adapted to move together and away from each other in response to transverse rectilinear movement of the body, a tensioned and self-biasing contact member is derived which assures that tension is applied to contact elements incorporated thereon as the contact elements are moved into and out of communication with the terminals. This same tension force also assures the retention of the switch contact member in its mounting receptacle so that additional parts, elements, adhesives or the like are unnecessary to either switch construction or operation. In the instance of the push button switch, effectively the apparatus comprises two individual parts while in the instance of the rocker tab switch, four parts are all that are required.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

We claim:

1. A switch apparatus for interconnecting electrical terminals comprising:
  - a movable body portion having a receptacle formed therein;
  - a self-biasing leaf spring member having an open single loop formed at its mid-section in frictional gripping and supporting relationship with said receptacle and a pair of divergent contact arms lying in the same plane integrally formed from opposite ends of said loop and spaced apart by the opening at said arms junction therewith; and each contact arm terminating in a flat integral contact element constantly under pressure of said self-biasing member spread apart from each other to interconnect the terminals in response to movement of said body portion.

2. An electrical switch apparatus for interconnecting terminals of conductive material carried on the surface of a circuit board comprising:

a body portion having a receptacle formed therein and adapted to move with respect to the circuit board;

a self-biasing member having an open single loop formed at its mid-section in frictional gripping and supporting relationship with said receptacle and a pair of divergent and resilient contact arms integrally formed from opposite ends of said loop so as to extend outwardly from said receptacle; and each contact arm terminating in an integral contact element adapted to slidably ride on the surface of the circuit board under constant pressure exerted by said self-biasing member to interconnect the terminals in response to movement of said body portion.

3. A switch apparatus for interconnecting electrical terminals carried on the surface of a circuit board comprising:

a movable body portion having an open receptacle formed therein facing the terminals in spaced relationship;

a tensioned self-biasing member having an open loop formed about its mid-section carried in said body portion receptacle and having a pair of divergent resilient contact arms spaced apart by the opening to said loop and projecting outwardly beyond said body portion receptacle wherein each of said arms pivots about an area adjacent the opening of said body portion receptacle and the opening to said loop responsive to movement of said body portion; and each contact arm terminating in an integral bifurcated contact element forcibly urged against the circuit board in sliding relationship and adapted to interconnect the terminals in response to pivotal movement of said contact arms.

4. An electrical switch apparatus for interconnecting spaced apart terminals of conductive material carried on the surface of a circuit board comprising:

a body portion having a receptacle formed therein and being movably mounted with respect to the circuit board;

a leaf spring member having divergent arms adapted to spread outwardly into and retract inwardly out of communication with the terminals in response to body portion movement;

said leaf spring member formed about its mid-section to provide an open single loop integrally joining said pair of arms so that said arms lie in the same plane and wherein said loop is frictionally engaged in gripping relationship with said body portion within said body portion receptacle; and the free ends of said pair of arms terminating in a contact element adapted to travel in a linear path on the surface of the circuit board between the terminals responsive to body portion movement and said contact elements always being in pressure contact with the circuit board.

5. An electrical switch apparatus for interconnecting terminals carried on the surface of a circuit board comprising:

a base for supporting the circuit board;

a panel carried on said base in fixed space relationship to the circuit board;

said panel having at least one cut-out formed therein;

a switch body disposed within each of said cut-outs and positionable through said cut-outs between said base and said panel;

said body portion having at least one receptacle in one end thereof opening in the direction of the circuit board;

a self biasing spring means carried in said body portion receptacle and having a pair of divergent resilient arms lying in the same plane extending therefrom in forcible sliding contact with the terminal board and adapted to move together and away from each other in response to movement of said body portion through said cut-out; and each of said contact arms terminating in an integral bifurcated contact element adapted to ride under constant pressure on the surface of the circuit board between the terminals in response to movement of said body portion so that the area between the terminals as well as the area of the terminals per se are wiped clean by said sliding action of said contact elements.

6. An electrical switch apparatus for interconnecting terminals of conductive material carried on the surface of a circuit board comprising:

a body portion having a receptacle formed therein opening in the direction of the circuit board;

a leaf spring member having resilient divergent arms adapted to spread into and retract out of communication with the terminals;

said leaf spring member formed about its mid-section to provide an open single loop integrally joining said multiplicity of arms wherein said loop is insertably disposed in frictional engagement within said body portion receptacle whereby said arms project exteriorly of said body portion receptacle under sliding tension against the surface of the circuit board; and each free end of said arms terminating in an integral bifurcated contact element adaptable to slidably travel in a linear path on the surface of the circuit board across and between the terminals so as to wipe the area over which said contact elements travel clean.

7. The invention as defined in claim 6 wherein the frictional engagement of said leaf spring member loop with said body portion in conjunction with said tensioned pairs of arms retains said leaf spring member within said body portion receptacle.

8. The invention as defined in claim 7 wherein said body portion receptacle opening is defined by walls having a chamfer adjacent the areas of said leaf spring member where said arms form with said loop adjacent the opening leading thereto.

9. The invention as defined in claim 8 wherein the areas of said leaf spring member where said arms form with said loop constitute a pivot point adjacent the opening leading into said loop about which each of said tensioned arms pivots responsive to movement of said body portion.

10. An electrical switch apparatus for interconnecting terminals carried on the surface of a circuit board comprising:

a base for supporting the circuit board;

a panel carried on said base in fixed space relationship to the circuit board;

said panel having a cut-out formed therein;

a switch body movably disposed within said cut-out and positionable through said cut-out between said base and said panel;

said body having a receptacle in one end thereof opening in the direction of the circuit board;

a leaf spring member carried in said body receptacle and having a pair of divergent resilient arms extending therefrom in slidable pressure contact with the terminal board and adapted to move together and away from each other under said sliding pressure contact in response to rectilinear movement of said body through said cut-out;

said leaf spring member formed about its mid-section to provide an open single loop integrally joining said pair of arms and wherein said loop is nipped at its top to urge said loop to expand outwardly to frictionally engage with said body within said body receptacle; and each of said contact arms terminating in an integral bifurcated contact element adapted to slidably travel under constant pressure on the surface of the circuit board between and across the terminals in response to linear movement of said body.

11. The invention as defined in claim 10 including stop means carried on said body portion biased against said panel by said tensioned leaf spring member and reacting against the surface of the circuit board to prevent said body portion from sliding through said panel.

12. The invention as defined in claim 11 including a finger contact portion located on said body portion at its end opposite to its end having said receptacle formed therein which projects through said panel cut-out.

13. The invention as defined in claim 12 including a guide pin carried on said body portion adjacent said receptable and slidably cooperating with the circuit board to permit rectilinear movement of said body portion in a plane normal to the surface of the circuit board.

14. An electrical switch apparatus for interconnecting terminals of conductive material carried on the surface of a circuit board comprising:

a body portion;

pivot means for mounting said body portion;

a block pivotally carried on said body portion and having an open receptacle formed therein facing the circuit board;

a leaf spring member having divergent arms adapted to spread outwardly into and retract inwardly out of communication with the terminals in response to body portion rotational movement;

said leaf spring member formed about its mid-section to provide an open single loop integrally joining said pair of arms and wherein said loop is nipped at its top to urge said loop to expand outwardly to frictionally engage with said block within said block receptacle; and the free ends of said pair of arms terminating in a contact element adapted to travel always under constant pressure in a path on the surface of the circuit board between and across the terminals responsive to body portion movement.

15. The invention as defined in claim 14 including an overcenter toggle means carried on the circuit board and operatively coupled to said body portion for resisting movement of said body portion until forced to a center position and thereafter imparting a snap action drive to a new rest position.

16. The invention as defined in claim 15 including a yoke downwardly projecting from said body portion, a block pivotally mounted on said yoke having the aforementioned receptacle formed therein whereby pivotal movement of said body portion is converted into a sliding movement of said contact elements.

17. An electrical switch apparatus for interconnecting terminals of conductive material carried on the surface of a circuit board comprising:

a rotatable body portion having a finger contact top portion and a yoke projecting downwardly in spaced relationship to the surface of the circuit board;

pivot means for rotatably mounting said body portion located between said top portion and said yoke;

a block pivotally carried by said body portion yoke and including an open receptacle formed therein opening in the direction of the circuit board;

a self biasing member carried in said block receptacle and configured to provide a pair of divergent arms projecting downwardly into slidable pressure contact with the surface of the circuit board whereby said arms become tensioned thereagainst;

each of said arms terminating in an integral bifurcated contact element adapted to ride on the surface of the circuit board under said contact pressure between the terminals in response to movement of said body portion; and overcenter detent means carried on the circuit board in operative contact with said body portion yoke to hold said body portion in selected positions.

18. The invention as defined in claim 17 wherein said self-biasing member includes a leaf spring formed about its mid-section to provide a spring loaded loop expandable within said block receptacle to forcibly engage the side walls thereof and wherein the areas of said self-biasing member where said arms form with said loop constitute a pivot point about which each of said tensioned arms flex responsive to movement of said body portion.

19. The invention as defined in claim 18 wherein said block includes a plurality of open receptacles adapted to insertably receive and frictionally retain a multiplicity of said self-biasing members and wherein said portions of said block separating said multiplicity of self-biasing members are composed of electrically insulative material or electrically conductive material as determined by the electrical circuit into which the terminals are incorporated.

References Cited

UNITED STATES PATENTS

| | | | |
|---|---|---|---|
| 2,469,650 | 5/1949 | Isserstedt | 200—159 X |
| 2,567,421 | 9/1951 | Brantingson | 200—159 |
| 3,225,156 | 12/1965 | Sahrbacker | 200—5 X |
| 3,246,087 | 4/1966 | Haviland | 200—5 X |

ROBERT K. SCHAEFER, *Primary Examiner.*

H. BURKS, *Assistant Examiner.*